US005583631A

United States Patent [19]

Lazzerini

[11] Patent Number: 5,583,631

[45] Date of Patent: Dec. 10, 1996

[54] ANTICOUNTERFEIT SECURITY DEVICE . . . INCLUDING TWO SECURITY ELEMENTS

[75] Inventor: Maurizio Lazzerini, Cerro Al Lambro, Italy

[73] Assignee: Mantegazza Antonio Arti Grafiche S.r.l., Milan, Italy

[21] Appl. No.: 585,438

[22] Filed: Dec. 8, 1995

Related U.S. Application Data

[63] Continuation of Ser. No. 194,975, Feb. 14, 1994, abandoned.

[30] Foreign Application Priority Data

Feb. 11, 1993 [IT] Italy ................................ MI93A0251

[51] Int. Cl.[6] ............................ G06K 9/74; G01N 21/00; G01N 27/72; G01R 33/12

[52] U.S. Cl. ............................ 356/71; 356/72; 324/226; 324/235

[58] Field of Search ........................ 356/72, 71; 235/493, 235/449; 324/226, 235

[56] References Cited

U.S. PATENT DOCUMENTS

| | | | |
|---|---|---|---|
| 3,599,153 | 8/1971 | Lewis | 235/493 |
| 4,180,207 | 12/1979 | Lee | 235/493 |
| 4,244,998 | 1/1981 | Smith | 428/195 |
| 4,303,949 | 12/1981 | Peronnet | 235/493 |
| 4,518,919 | 5/1985 | Ishida | 324/228 |
| 4,756,557 | 7/1988 | Kaule et al. | 283/85 |
| 4,941,687 | 7/1990 | Grane | 283/91 |
| 5,161,829 | 11/1992 | Detrick et al. | 283/91 |

FOREIGN PATENT DOCUMENTS

| | | |
|---|---|---|
| 0057520 | 8/1982 | European Pat. Off. . |
| 0094775 | 11/1983 | European Pat. Off. . |
| 0310707 | 4/1989 | European Pat. Off. . |
| 0185396 | 6/1989 | European Pat. Off. . |
| 0330733 | 9/1989 | European Pat. Off. . |
| 9208226 | 5/1992 | WIPO . |
| 9211142 | 7/1992 | WIPO . |

*Primary Examiner*—Frank Gonzalez
*Assistant Examiner*—Jason D. Eisenberg
*Attorney, Agent, or Firm*—Guido Modiano; Albert Josif

[57] ABSTRACT

An anti-counterfeit security device for documents in general in the form of a tape-like or filament-like supporting element made of polyester. On the tape or filament, a first security element is provided which can be detected by devices and is constituted by regions made of a material which can be detected by magnetoresistors and are arranged in succession to generate a signal that can be decoded by the magnetoresistors, and a second security element is also provided, visually detectable in transmitted light, which is constituted by portions of the regions that are free from the magnetoresistor-detectable material in order to form graphic markings optically perceivable in transmitted light.

3 Claims, 1 Drawing Sheet

SPECIMEN SPECIMEN
10
2a
2b
2c

1

5 (MAGNETORESISTORS)
20
2
30

ANTICOUNTERFEIT SECURITY DEVICE . . . INCLUDING TWO SECURITY ELEMENTS

This is a continuation application of application Ser. No. 08/194,975 filed on Feb. 14, 1994, now abandoned.

BACKGROUND OF THE INVENTION

The present invention relates to an anti-counterfeit security device for documents in general.

As is known, security devices are currently inserted in many documents, such as for example bank notes; these devices are constituted by filaments with such characteristics as to increase the difficulties in reproducing these documents.

Among known security devices, mention is made of the one disclosed in European Patent No. 310,707, which in practice consists in depositing, on a support made of flexible and impermeable material, such as for example a polyester tape, regions of magnetic material, such as iron oxide, which either due to their different thickness or due to their different deposition area have, when passing beneath a magnetic head, a signal/flux directly correlated to the amount of oxide, taking into account that the filament is generally manufactured with a constant width.

It is customary to subsequently cover these regions of magnetic material with inks that are highly opaque to transmitted light, so that it is optically impossible to detect the presence and arrangement of the regions of magnetic material.

This document, viewed in reflected light, has a barely perceptible line at the filament or tape, whereas in transmitted light it is fully opaque along the same line.

These regions of magnetic material are magnetized by means of a permanent magnet which in practice charges the iron oxide so that it maintains the magnetic flux in order to be a signal-emitting element. The signals are detected by magnetic heads which, by means of appropriate electronic devices and associated programs, allow to form a decodable code, according to the thickness, density, position and/or succession of the magnetic regions.

In order to detect the magnetic flux of the regions composed using iron oxide, these regions must be moving beneath the magnetic head; this movement increases the signal as a function of the speed in a substantially proportional manner.

With this type of solution, it is not possible to detect the signal emitted by the iron oxide regions with magnetic heads if there is no relative motion between the magnetic regions and the heads.

With this kind of security element, a counterfeiter can in practice detect only its presence but is unable to detect its arrangement.

However, this security device is detectable only by means of specifically dedicated devices, and in practice cannot be detected visually, since, as mentioned above, visually it is only possible to identify the presence of a filament, without however being able to determine whether it has the required characteristics.

Another known solution uses an impermeable flexible support, constituted by a polyester tape or filament, provided with a continuous metal layer that makes said filament conductive and therefore detectable by an apparatus which, however, can only detect the presence or absence of said filament.

The metal layer has regions without metal which practice form graphic signals, for example letters or the like, which are visually perceivable and thus detectable directly without using an apparatus.

As is evident, the regions without metal, i.e. the regions that form the graphic markings, must be fully surrounded by metal in order to avoid altering the metallic continuity of the filament.

Furthermore, the metal layer can also be obtained by depositing metals through evaporation.

The document obtained by inserting the filament inside the paper has the particularity that the presence of the filament cannot be detected when it is examined in reflected light, whereas in transmitted light the graphic signals are perfectly legible.

A considerable problem for this filament is constituted by the fact that it is relatively easy to counterfeit it, since the materials required to form the metal layer and the corresponding graphic markings are normally commercially available; these counterfeits can easily deceive both personnel, when performing a visual inspection, and the equipment for detecting the presence or absence of the filament inside the document.

It is thus evident from the known art that two filaments are already known: the first one, i.e. the one provided with the magnetic regions, allows coding with a system that deposits layers with different thickness of a material which is magnetic or in any case produces a different magnetic intensity and is highly reliable both for decoding, since it is non-erasable, and for security, since it is obtained with a code, but can be decoded only with specifically provided equipment; the other filament instead can be decoded visually by personnel and can be detected by means of an apparatus that allows to check for the presence of the filament, but on the other hand can be counterfeited in a relatively easy manner.

In order to solve the above described problem, solutions have already been used commercially that in practice insert inside the document, for example a bank note, two filaments, i.e. a filament with magnetic regions ensuring absolute security against counterfeiting and a second filament allowing the personnel to visually check the document.

However, as is evident, the use of two filaments has drawbacks in the manufacture of the paper and in any case in practice provides two mutually separate elements: one that can be checked visually by personnel and the other that can be checked automatically by a device.

SUMMARY OF THE INVENTION

A principal aim of the present invention is to solve the problem described above by providing an anti-counterfeit security device for documents in general that can both be decoded by appropriate devices, providing a high degree of intrinsic security, and be decoded visually by virtue of the possibility of detecting graphic markings perceivable in transmitted light.

Another aim of the invention is to provide a security device that combines the typical characteristics of the known art in two separate elements, allowing to provide a single element, i.e. in practice a single filament having both characteristics.

Another aim of the present invention is to provide a security device allowing to further increase the security characteristics, offering a wide range of combinations, all of which are aimed at making the document safer by virtue of the practical impossibility for a counterfeiter to detect the security elements.

Another aim of the present invention is to provide an anti-counterfeit security device for documents in general that can be obtained with simple techniques and can be inserted inside the document like the filaments conventionally used up to now.

With these and other aims in view, there is provided, according to the present invention, an anti-counterfeit security device for documents in general, in the form of a tape-like supporting element comprising: a first security element detectable by devices and constituted by regions that are made of a material which can be detected by magnetoresistors and are arranged in succession to generate a signal that can be decoded by said magnetoresistors; and a second security element, detectable in transmitted light, which is constituted by portions of said regions which are free from said magnetoresistor-detectable material in order to form graphic markings that can be perceived optically in transmitted light.

BRIEF DESCRIPTION OF THE DRAWINGS

Further characteristics and advantages of the present invention will become apparent from the following detailed description of some preferred but not exclusive embodiments thereof, illustrated only by way of non-limitative example in the accompanying drawings, wherein.

DESCRIPTION OF THE PREFERRED EMBODIMENTS

Figures 1, 2, 3:
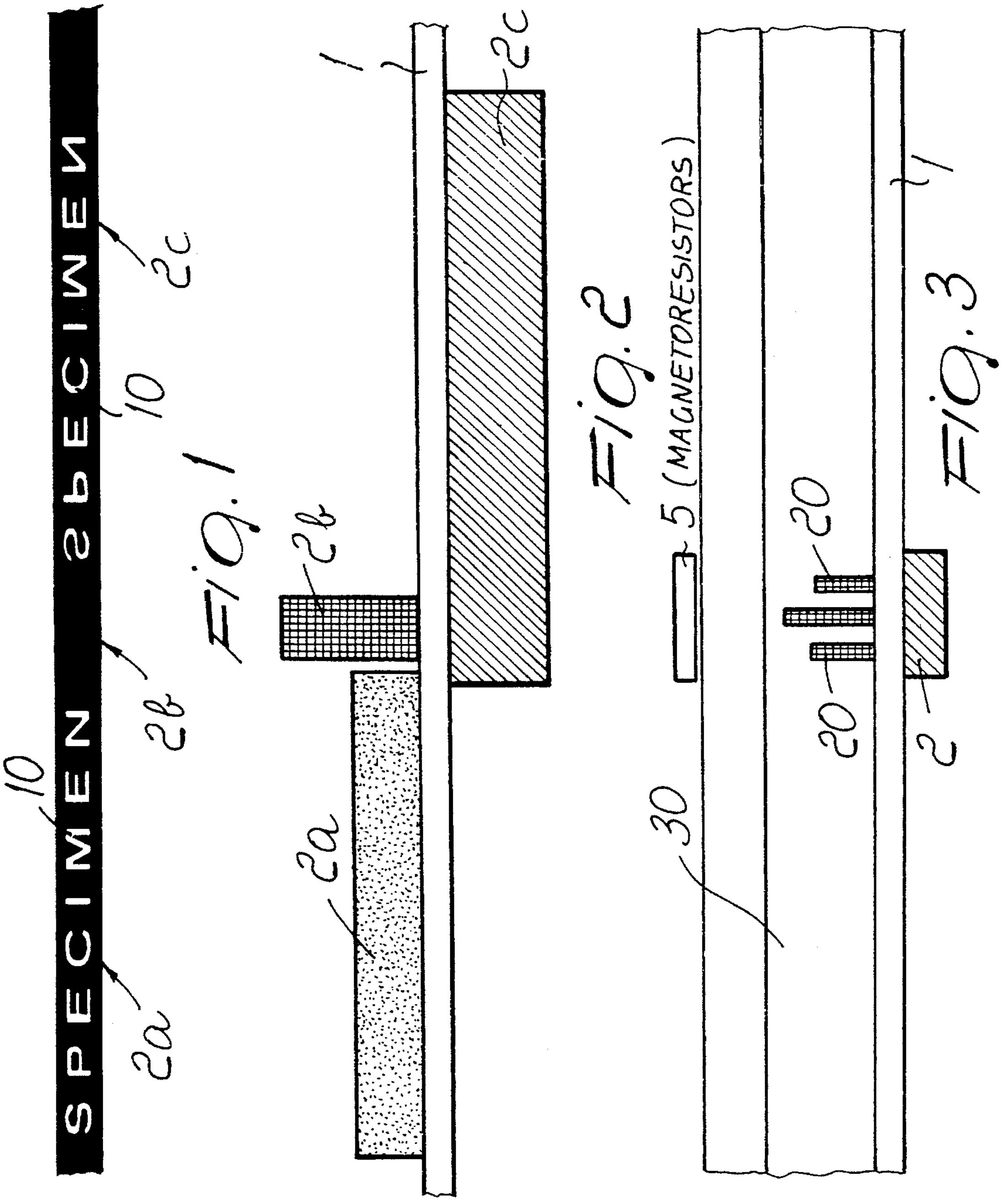
FIG. 1 is a schematic view of the security device, constituted by a filament, as it substantially appears and as can be detected in transmitted light.
FIG. 2 is a longitudinal sectional view of the filament, illustrating the regions made of magnetoresistor-detectable material.
FIG. 3 is a view of the security device according to the invention which also uses regions made of magnetic material to form an additional code that can be detected by devices.

With reference to the above figures, the anti-counterfeit security device for documents in general, according to the invention, comprises a supporting element, designated by the reference numeral 1, which is advantageously constituted by a filament or tape made of flexible and impermeable material, for example polyester.

A first security element that can be detected by devices specifically equipped for this purpose is provided on said filament 1 on one of its faces or possibly on both.

Said first security device is constituted by regions, designated by the reference numerals 2*a*, 2*b* and 2*c*, which are made of a material detectable by magnetoresistor. Said material is constituted for example by a printable ink containing iron dust.

It is possible to vary both the thickness of the various regions, i.e. the height of the region with respect to the filament forming the support, and the percentage of iron dust that is included.

In the specific example, the various regions 2*a*, 2*b* and 2*c* are formed with different thicknesses and with different percentages of iron dust; these percentages can be constituted, for example, by 15%, 30% and 50% of iron dust mixed in a reflective ink containing some aluminum parts, generally 3%.

The various regions made of magnetoresistor-detectable material, i.e. containing iron dust, are placed succession so as to form a signal that can be decoded by the magnetoresistors, which can in practice detect, by means of a static measurement, i.e. with no relative motion between the read head and the support, a signal variation produced by the different amount of iron dust, i.e. by the different amount of the material detected by the magnetoresistor.

On at least some of said regions 2*a*, 2*b* or 2*c* there is a second security element that can be detected visually in transmitted light and is constituted by portions 10 which are free from said magnetoresistor-detectable material, so as to form graphic markings, symbols, letters of the alphabet and so forth, that can be perceived optically in transmitted light.

In practice it is possible to provide lettering that can be detected only in transmitted light, i.e. in practice when holding the document up to and against the light, whereas in reflected light the security device inserted in the document in practice forms a substantially uniform line, without allowing to identify and perceive the lettering that is present.

Advantageously, said magnetoresistor-detectable material contains iron dust that is ground with a particle size of less than 15 microns, since the finer the pulverization of the iron dust, the higher the optical definition of the lettering and the higher the uniformity of the signal detected by the magnetoresistors.

If larger particles are used, the characteristics described above remain valid, with the difference that a lower optical definition of the part detectable in transmitted light and a lower uniformity in the detected signal are obtained.

To the above it should be added that it is possible to use, in combination with the above described security elements, an additional security element constituted by regions made of magnetic material 20 which are constituted for example by an iron-oxide ink, so as to produce a code that can be detected by a magnetic read head.

Furthermore, as shown in FIG. 3, it is possible to provide the regions 2 with ink containing magnetoresistor-detectable material arranged at said magnetic regions 20.

The magnetic regions must be arranged so as to not interfere with the portions that are free from the magnetoresistor-detectable material, thus without hindering the optical detection of the graphic markings transmitted light.

It is also possible to provide a security device which said magnetic regions forming a code are provided on a filament, again designated by the reference numeral 1, in which the graphic markings that can be perceived in transmitted light are printed with normal printing ink 30, thus creating two security devices: a magnetic one, that can be detected by magnetic read heads, and an optical one that can be detected against the light.

From what has been described above it can thus be seen that the invention achieves the intended aims, and particularly the fact is stressed that a security device is provided that allows, if regions formed with iron dust are used, to perform static-type reading by means of magnetoresistors, since it is possible to create a code by varying the percentages or amounts of iron dust provided in the various regions.

Another important object of the invention is furthermore constituted by the fact that the security device can be provided visually, by virtue of the possibility of detecting the lettering or graphic markings in transmitted light, on a tape that cannot be counterfeited, since the remaining portions have depositions of material forming a code that can be decoded only by specific devices.

The invention thus conceived is susceptible to numerous modifications and variations, all of which are within the scope of the inventive concept.

All the details may furthermore be replaced with other technically equivalent elements.

In practice, the materials employed, as well as the contingent shapes and dimensions, may be any according to the requirements.

What is claimed is:

1. Anti-counterfeit security device for documents in general, comprising a tape like supporting element supporting:

a first security element constituted by regions that are made of a material which can be statically detected by magnetoresistors, said regions being arranged in succession and being formed by ink containing iron dust, said regions comprising at least one first region made of said ink which contains a first percentage of iron dust and at least one second region made of said ink which contains a second percentage of iron dust which differs from said first percentage, thereby to generate a coded signal that can be statically detected by said magnetoresistors; and a second security element, visually detectable in transmitted light, which is constituted by portions of at least some of said regions which are free from said ink in order to form graphic markings that can be perceived optically in transmitted light.

2. Security device according to claim 1, comprising an additional security element constituted by regions made of magnetic material that form a read code, said regions made of magnetic material being located in different points with respect to said regions that are free from said ink.

3. Security device according to claim 1, wherein said ink forms regions that have a different response to reading by means of said magnetoresistors by varying a thickness of said region.

* * * * *